(12) United States Patent
Bean, Jr.

(10) Patent No.: US 9,072,201 B2
(45) Date of Patent: Jun. 30, 2015

(54) CONTAINER AIR HANDLING UNIT AND COOLING METHOD

(75) Inventor: John H. Bean, Jr., Wentzville, MO (US)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 534 days.

(21) Appl. No.: 12/792,161

(22) Filed: Jun. 2, 2010

(65) Prior Publication Data
US 2010/0300650 A1 Dec. 2, 2010

Related U.S. Application Data

(60) Provisional application No. 61/183,276, filed on Jun. 2, 2009.

(51) Int. Cl.
H05K 7/20 (2006.01)

(52) U.S. Cl.
CPC ........ H05K 7/20745 (2013.01); H05K 7/20345 (2013.01); H05K 7/20827 (2013.01)

(58) Field of Classification Search
CPC .......... H05K 7/20345; H05K 7/20354; H05K 7/20754; H05K 7/20745; H05K 7/20827
USPC ................ 62/259.2, 259.4, 310, 314; 165/67; 361/678, 695, 700, 688, 699
See application file for complete search history.

(56) References Cited

U.S. PATENT DOCUMENTS

| | | | | |
|---|---|---|---|---|
| 3,480,174 A | * | 11/1969 | Sherwood | 220/1.5 |
| 4,852,362 A | * | 8/1989 | Conry | 62/175 |
| 6,338,256 B1 | * | 1/2002 | Tien | 62/305 |
| 6,604,370 B2 | * | 8/2003 | Bash et al. | 62/171 |

(Continued)

FOREIGN PATENT DOCUMENTS

| | | |
|---|---|---|
| CN | 85106145 A | 3/1987 |
| WO | 86/00977 A1 | 2/1986 |

(Continued)

OTHER PUBLICATIONS

International Search Report for PCT/US2010/037084 mailed Dec. 12, 2010.

*Primary Examiner* — Mohammad M Ali
*Assistant Examiner* — Raheena Rehman
(74) *Attorney, Agent, or Firm* — Lando & Anastasi LLP

(57) ABSTRACT

A modular cooling system configured to treat IT air generated by a data center includes a frame and a plurality of cooling sub-system modules supported by the frame. The plurality of cooling sub-system modules are configured to operate in parallel to achieve total cooling effect or a lesser cooling effect with some level of redundancy within the data center. Each cooling sub-system module includes a housing configured to support cooling equipment, an air-to-air heat exchanger supported by the housing to cool IT air generated by the data center, the air-to-air heat exchanger having at least one tube configured to direct IT from one end of the air-to-air heat exchanger to an opposite end of the air-to-air heat exchanger and configured so that outdoor air circulates around the at least one tube, and a mechanical cooling system supported by the housing. The mechanical cooling system is configured to receive IT air treated by the air-to-air heat exchanger and to provide further cooling to the treated IT air. Other embodiments of the cooling system and methods of cooling are further disclosed.

15 Claims, 13 Drawing Sheets

(56) References Cited

U.S. PATENT DOCUMENTS

| | | | |
|---|---|---|---|
| 6,924,981 B2 * | 8/2005 | Chu et al. | 361/696 |
| 7,093,452 B2 * | 8/2006 | Chee et al. | 62/175 |
| 7,128,310 B2 * | 10/2006 | Mockry et al. | 261/112.1 |
| 7,233,492 B2 * | 6/2007 | Staben et al. | 361/695 |
| 7,278,273 B1 * | 10/2007 | Whitted et al. | 62/259.2 |
| 7,365,973 B2 * | 4/2008 | Rasmussen et al. | 361/694 |
| 7,793,467 B1 | 9/2010 | Melton et al. | |
| 7,852,627 B2 * | 12/2010 | Schmitt et al. | 361/695 |
| 7,905,105 B2 * | 3/2011 | Fair et al. | 62/259.2 |
| 2003/0094006 A1 | 5/2003 | Des Champs et al. | |
| 2007/0101746 A1 * | 5/2007 | Schlom et al. | 62/310 |
| 2011/0063778 A1 * | 3/2011 | Brouillard | 361/695 |

FOREIGN PATENT DOCUMENTS

| | | |
|---|---|---|
| WO | 89/12790 A1 | 12/1989 |
| WO | 00/70273 A1 | 11/2000 |
| WO | 2005/090869 A1 | 9/2005 |

\* cited by examiner

CONTAINER AIR HANDLING UNIT AND COOLING METHOD

RELATED APPLICATION

This application claims priority under 35 U.S.C. §119(e) to U.S. Provisional Application No. 61/183,276, entitled "ISO CONTAINER SUB-BASE WITH ADIABATIC ASSIST AIR ECONOMIZER," filed Jun. 2, 2009, which is hereby incorporated by reference in its entirety for all purposes.

BACKGROUND OF THE DISCLOSURE

1. Field of the Disclosure

Embodiments of this disclosure relate generally to systems and methods for cooling a data center, which houses information technology equipment, such as servers, network switches, data storage and similar devices.

2. Discussion of Related Art

Data centers employing equipment enclosures or racks for housing electronic equipment, such as data processing, networking and telecommunications equipment have been used for many years. Heat produced by rack-mounted equipment can have adverse effects on the performance, reliability and useful life of the equipment components located within the data center. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

There are many approaches to cooling data centers. Previously, in certain configurations, data centers have been cooled by a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air and discharge cold air, which is blown into the data center room and mixed with the room temperature air at or near the equipment racks. Mobile cooling units may also be employed.

SUMMARY OF THE DISCLOSURE

One aspect of the present disclosure is directed to a modular cooling system configured to treat IT air generated by a data center. In one embodiment, the modular cooling system comprises a frame and a plurality of cooling sub-system modules supported by the frame. The plurality of cooling sub-system modules are configured to operate in parallel to achieve total cooling effect or a lesser cooling effect with some level of redundancy within the data center. In a certain embodiment, each cooling sub-system module comprises a housing configured to support cooling equipment, an air-to-air heat exchanger supported by the housing to cool IT air generated by the data center, the air-to-air heat exchanger having at least one tube configured to direct IT from one end of the air-to-air heat exchanger to an opposite end of the air-to-air heat exchanger and configured so that outdoor air circulates around the at least one tube, and a mechanical cooling system supported by the housing. The mechanical cooling system is configured to receive IT air treated by the air-to-air heat exchanger and to provide further cooling to the treated IT air.

Embodiments of the modular cooling system further comprise a fluid communications network that interconnects cooling sub-system modules of the modular cooling system with the data center to deliver cool air to the data center and to exhaust warm air from the data center. The fluid communications network includes a supply duct configured to deliver cooled or treated air from the cooling sub-system modules to the data center and a return duct configured to deliver IT air from the data center to the cooling sub-system modules. In one embodiment, the frame is an ISO frame that is located outside the data center. Each cooling sub-system module further comprises an evaporative cooling apparatus supported by the housing, the evaporative cooling apparatus being configured to spray water on the at least one tube. The modular cooling system further comprising a water distribution and collection system configured to deliver cooling water to the evaporative cooling apparatus of the plurality of cooling sub-system modules and collect cooling water from the plurality of cooling sub-system modules. The evaporative cooling apparatus includes a sprayer, and the water distribution and collection system includes a collection trough and a pump connected to the sprayer. The sprayer is configured to spray water on the at least one tube and the collection trough is configured to collect water sprayed on the at least one tube. The plurality of cooling sub-system modules are positioned along an exterior of the frame and the water distribution and collection system is positioned interiorly with respect to the plurality of cooling sub-system modules. In a certain embodiment, the at least one tube comprises a plurality of tubes. The mechanical cooling system comprises a compressor, a condenser coil, and an evaporator coil. The modular cooling system further comprises at least one fan supported by the housing, the at least one fan being configured to circulate outdoor and IT air. The at least one fan includes a first fan configured to direct outdoor air to the at least one tube and a second fan configured to direct IT air into the at least one tube.

Another aspect of the disclosure is directed to a method of cooling IT air. In one embodiment, the method comprises: delivering IT air from a data center to tubes of a plurality of air handling units; delivering outside air around the tubes; spraying water on the tubes; delivering IT air from the tubes to a mechanical cooling system; and returning treated IT air back to the data center from the plurality of air handling units.

Embodiments of the method are further disclosed. In a certain embodiment, IT air delivered from the data center to the tubes of the plurality of air handling units travels through a return duct. Treated IT air returned back to the data center from the plurality of tubes travels through a supply duct. The plurality of air handling units is contained within an ISO frame. The method further comprises delivering water to the plurality of air handling units from a water distribution and collection system and/or collecting water from the plurality of air handling units. Delivering IT air from the data center to the tubes and delivering outside air around the tubes are achieved by using fans.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

Figure 1:
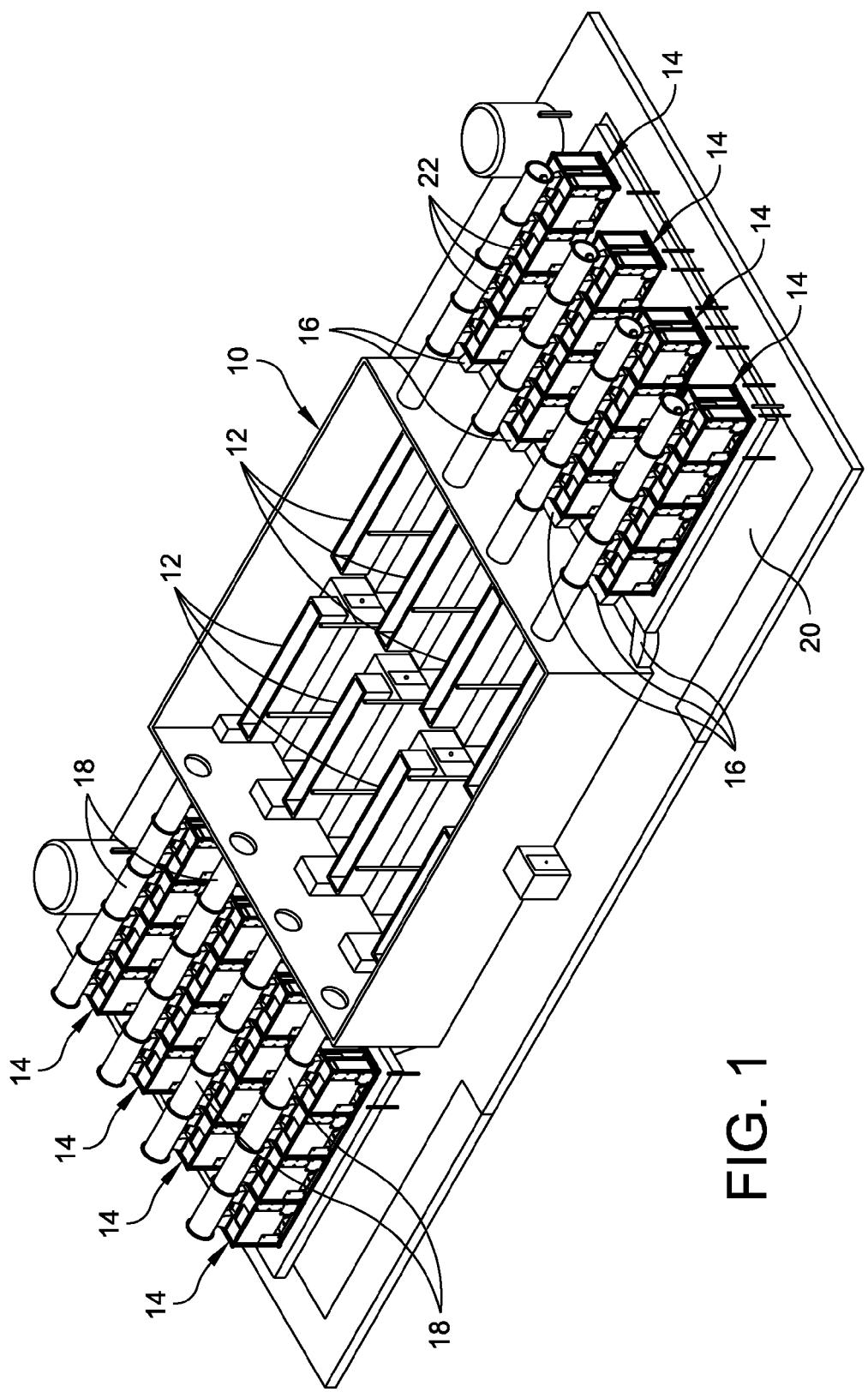
FIG. 1 is a perspective view of an exemplary data center having a cooling system of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The present disclosure is directed to a modular cooling system that is configured to house a plurality of cooling sub-system modules that operate in parallel to achieve total cooling effect or a lesser cooling effect with some level of redundancy. In one embodiment, each cooling sub-system module includes an air-to-air heat exchanger that is configured to cool IT air with outdoor air and an evaporative cooling apparatus. After IT air passes through the air-to-air heat exchanger, the air is delivered to a mechanical cooling system that is configured to further cool the IT air prior to the air being delivered back to the data center.

The modular cooling system of embodiments disclosed herein is especially adapted to treat air from a data center. In one particular embodiment, the modular cooling system includes a plurality of cooling sub-system modules housed within an ISO frame. The ISO frame is configured provide cool air to a data center by way of a supply duct and treat warmed air generated from the data center by way of a return duct. In a certain embodiment, the ISO frame is provided outside the data center.

Referring now to the drawings, and in particular to FIG. 1, a data center is generally indicated at 10. As shown, the data center 10 includes rows of equipment racks, each row indicated at 12. The equipment racks 12 are designed to house electronic equipment, such as data processing, networking and telecommunications equipment. During operation the electronic equipment generates heat that needs to be treated to ensure the continued performance, reliability and useful life of the equipment components housed by the equipment racks 12. Embodiments of the cooling systems disclosed herein are designed to treat the heat produced by the electronic equipment within the data center 10 and return cool air back to the data center.

In one embodiment, several modular cooling containers, each generally indicated at 14, are connected to the data center 10 from outside the data center. The cooling containers 14 are adapted to receive hot air (sometimes referred to herein as "IT air") from the data center 10 and to return treated or cooled air back to the data center. In one embodiment, each cooling container 14 may include an ISO frame that is modified to provide suitable housing and protection for cooling equipment. As shown in FIG. 1, there are eight such cooling containers 14 configured to treat IT air within the data center 10. It should be understood that depending on the size and shape of the data center 10, any number of cooling containers 14 may be provided to address the cooling requirements of the data center. Also, depending on the constraints dictated by the space surrounding the data center 10, the size and shape of each container 14 may be modified. In order to deliver cool air to the data center 10, each cooling container 14 includes a supply duct 16 located at the bottom of the container and a return duct 18 located above the container. In a certain embodiment, the supply duct 16 may be disposed within a raised floor 20 that supports the containers 14 or that is built within the interior of each container. The return duct 18 may be supported above the container 14 by several supports each indicated at 22 provided along the length of the container. In other embodiments, the supply duct may be provided on top or on a side of the container and the return duct may be provided on the bottom or side of the container. The supply duct 16 and the return duct 18 form part of a fluid communications network that enables relatively warm IT air to travel from the data center 10 to the cooling container 14 and cooled or treated air to travel from the cooling container back to the data center.

Figure 2A:
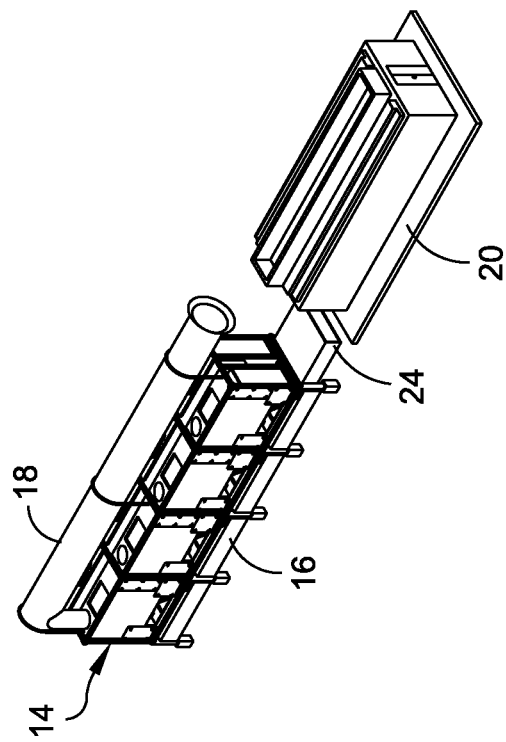
FIGS. 2A and 2B are perspective views of an airflow interface of one embodiment of the disclosure.
Figure 2B:
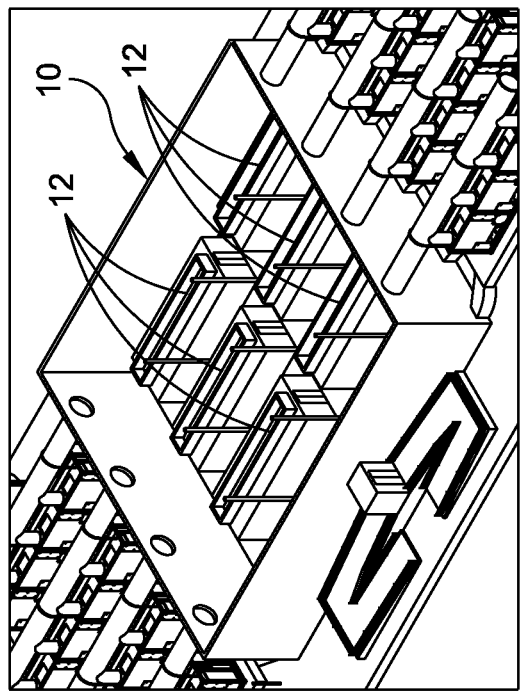
Figure 3A:
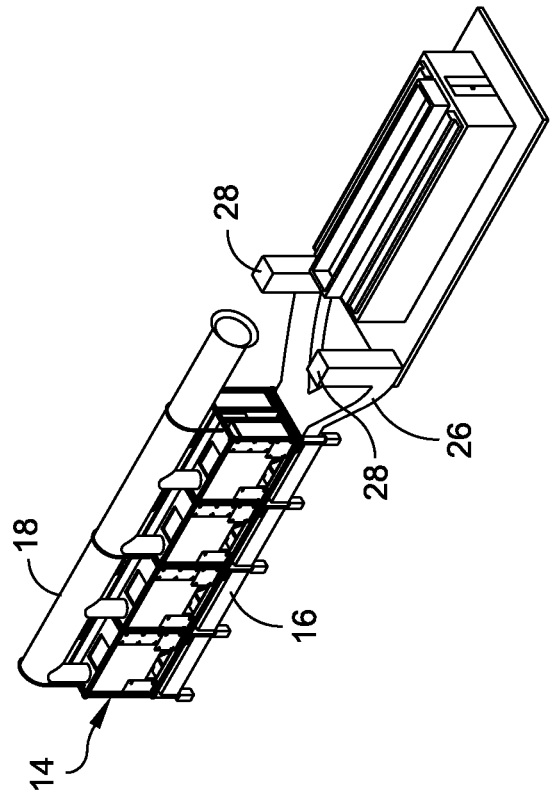
FIGS. 3A and 3B are perspective views of an airflow interface of another embodiment of the disclosure.
Figure 3B:
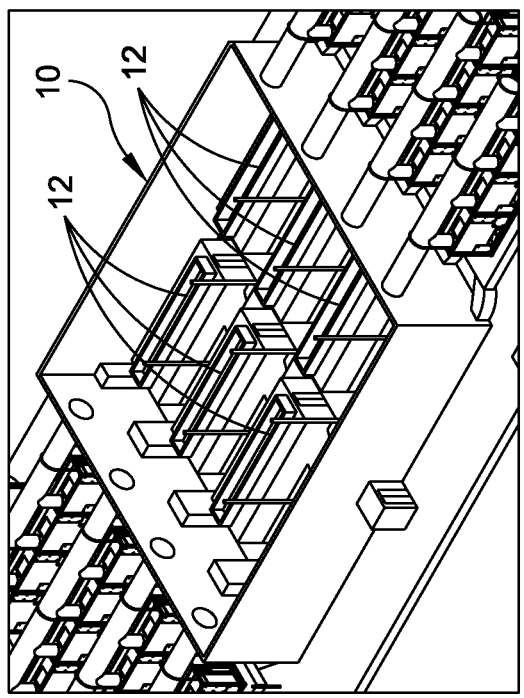

With additional reference to FIGS. 2A, 2B, 3A, 3B and 4, the interface between the data center 10 and each cooling container 14 may embody a raised floor configuration 24 shown in FIGS. 2A and 2B and a hard floor configuration 26 shown in FIGS. 3A and 3B. The raised floor configuration 24 includes connecting the supply duct 16 of the cooling container 14 with a suitable connection provided in the raised floor 20 of the data center 10 and connecting the return duct 18 of the cooling container with a suitable connection provided in the open space or duct work provided in the data center. The hard floor configuration 26 includes connecting the return duct 18 to the data center 10 in a manner similar to the raised floor configuration 24. However, the hard floor configuration 26 includes a pair of wall diffusers 28 that are constructed to deliver cooled air back to the data center 10. It should be understood that any suitable configuration may be provided to deliver cooled air from the cooling container 14 back to the data center 10 and to exhaust warm air from the data center to the cooling container. The raised floor and hard floor configurations 24, 26 are exemplary of two approaches to achieve this purpose.

Figure 4:
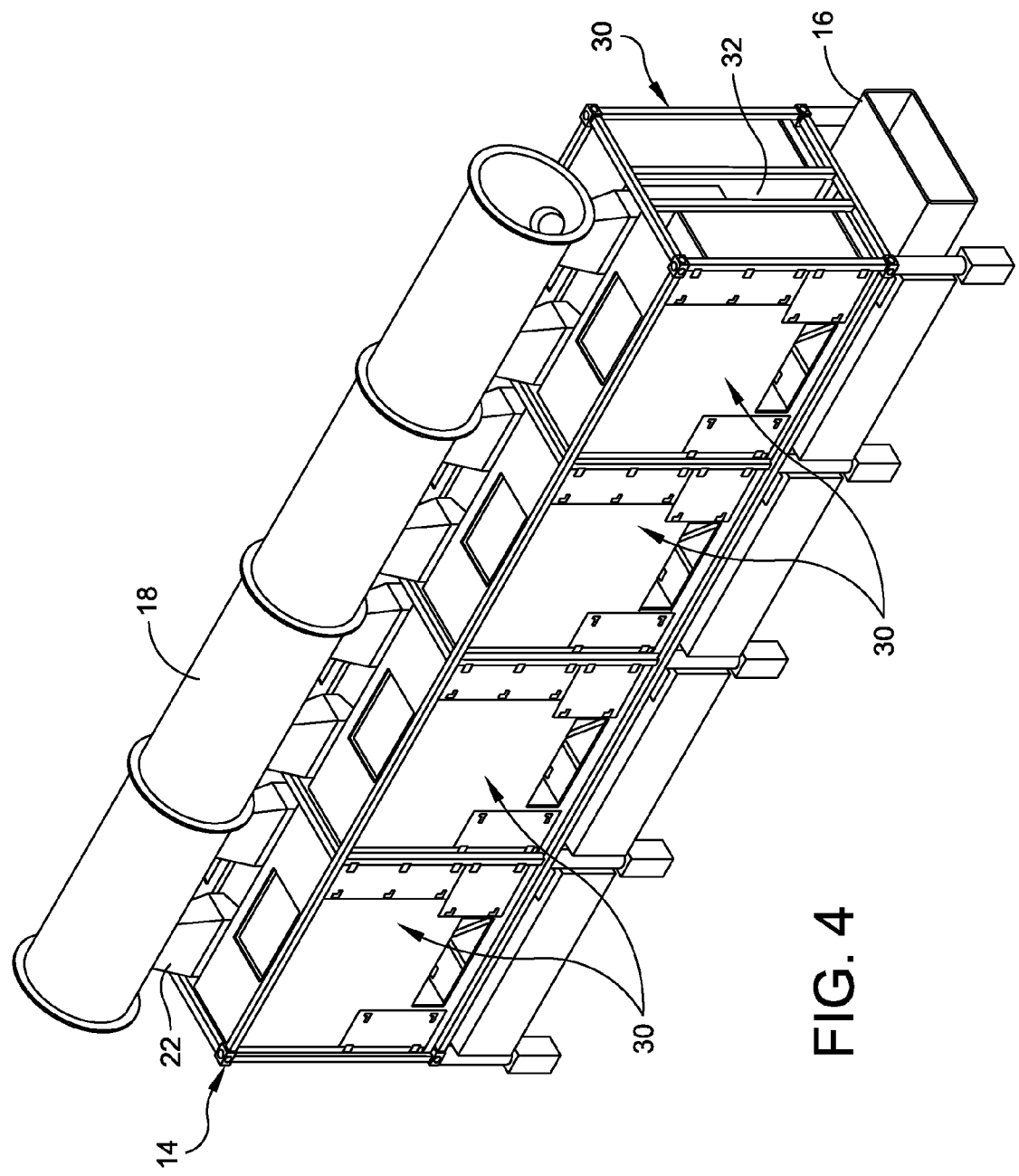
FIG. 4 is an enlarged perspective view cooling system shown in FIG. 1 and the airflow interface shown in FIGS. 2A and 2B.

Referring now to FIG. 4, each cooling container 14 includes a plurality of air handling units, each generally indicated at 30. The air handling unit 30 may sometimes be referred to herein as a cooling sub-system module. The air handling units 30 are configured within the container 14, e.g., the ISO frame, to operate in parallel to achieve total cooling effect or a lesser cooling effect with some level of redundancy. As shown, in one embodiment, four air handling units 30 may be provided on one side of the container 14 and four air handling units are provided at the other side of the container. The arrangement is such that there is a narrow space 32 in the middle of the container 14, the purpose of which will be described as the description of the embodiment proceeds. The container 14 is configured so that IT air delivered from the data center 10 through the return duct 18 enters the air handling units 30. Once treated, conditioned (cool) air is delivered from the air handling units 30 to the supply duct 16 for delivery to the data center 10.

Figure 5:
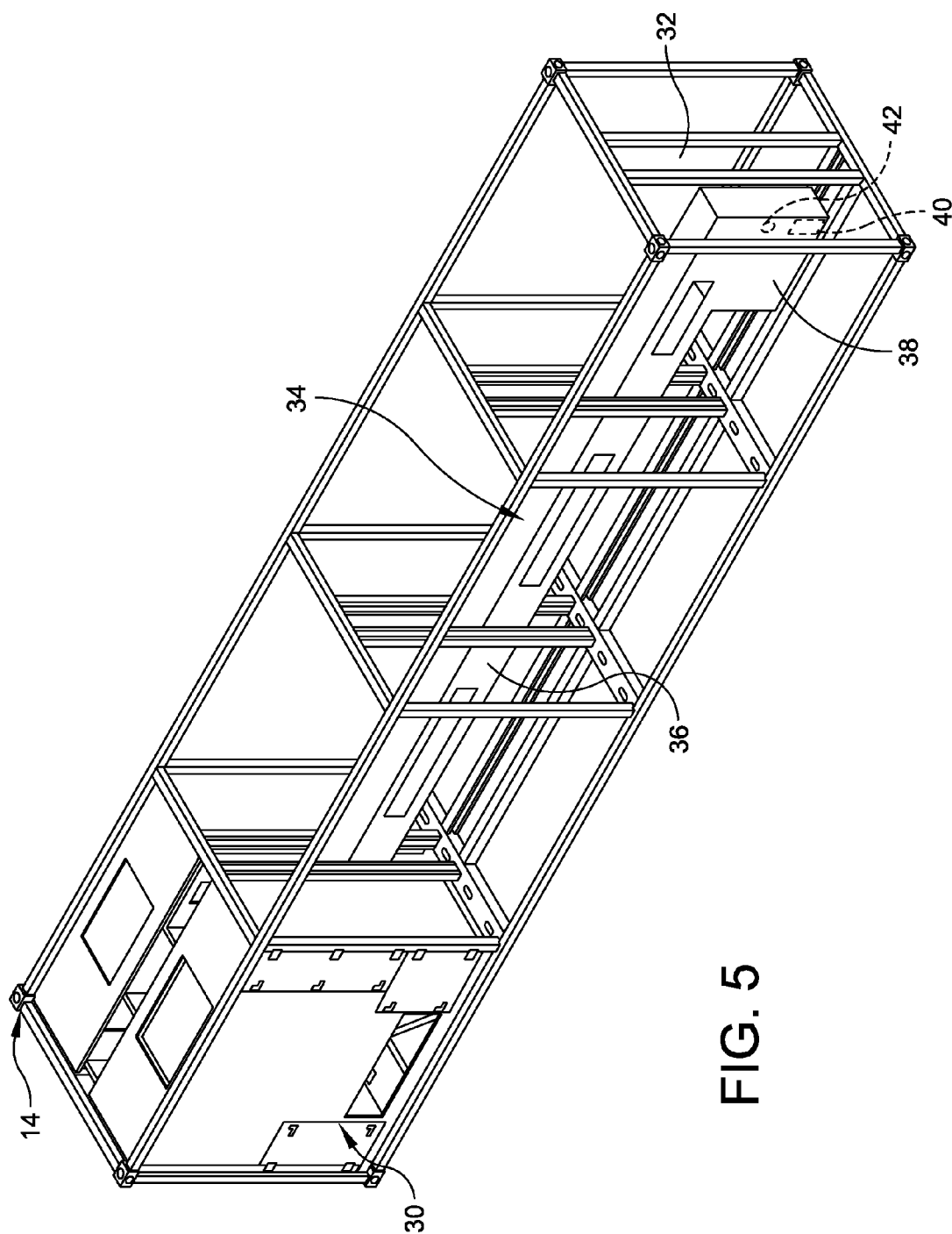
FIG. 5 is an enlarged perspective view of the cooling system shown in FIG. 4 with cooling units and the airflow interface removed to show internal components of the cooling system.

Turning to FIG. 5, the container 14 includes a water distribution and collection system, generally indicated at 34, that is positioned along a chase between the two rows of air handling units 30. As shown, the water distribution and collection system 34 includes a centrally positioned trough 36 having a water distribution piping network (not shown) contained within the central chase area configured to deliver water to the air handling units 30 and to receive sprayed water from the air handling units. The water distribution and collection system 34 includes a water supply unit 38 positioned at one end of the trough 36. Provided within the water supply unit 38 is a pump or pumps indicated by dashed lines 40 to pump water (or any other appropriate cooling medium) from the water supply unit to the air handling units 30 and a float indicated by dashed lines 42 to ensure an appropriate amount of water is held by the water supply unit. Suitable piping contained within the central chase is provided to deliver water from the water supply unit 38 to the air handling units 30. The purpose of the water distribution and collection system 34 will be described below when discussing the air handling units 30.

Figure 6:
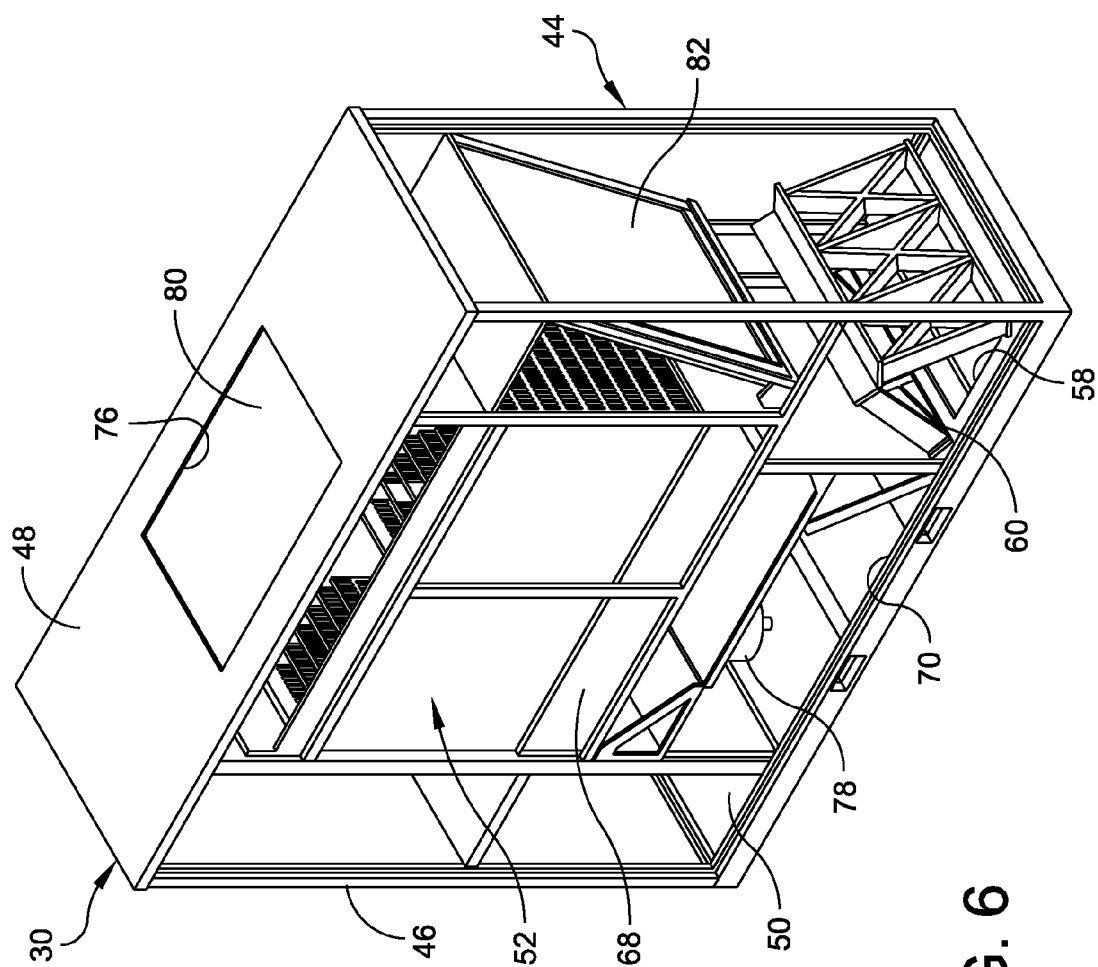
FIG. 6 is a front perspective view of an air handling unit of an embodiment of the cooling system with portions of the unit removed to show an interior of the unit.
Figure 7:
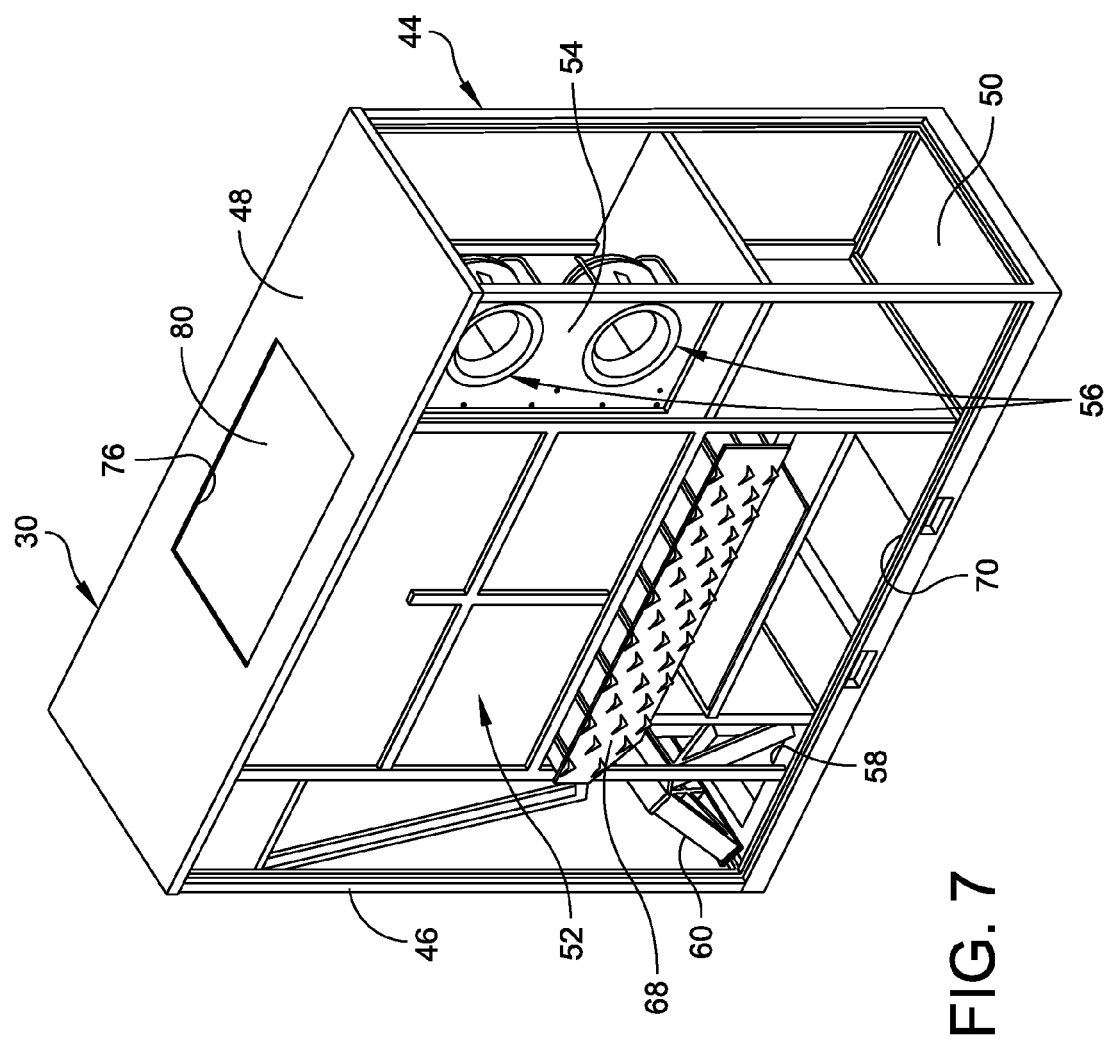
FIG. 7 is a back perspective view of the air handling unit shown in FIG. 6.

Referring to FIGS. 6 and 7, the air handling unit 30 includes a generally box-shaped housing, generally indicated at 44, that is configured to support cooling equipment. The housing 44 includes a frame 46, a top panel 48, a bottom panel 50, and side panels (not designated but shown in FIG. 4), which are removed in FIGS. 6 and 7 to show the cooling components provided within the housing. As shown, the housing 44 supports an air-to-air heat exchanger, generally indicated at 52, and a mechanical cooling system. The air-to-air heat exchanger 52 is suitably supported by the housing 44 and is configured to receive air through an inlet port 54 provided in the back of the housing. As shown, two fans each indicated at 56 are provided within the port 54 to direct air from the return duct 18 to the heat exchanger 52. The arrangement is such that IT air travels from the return duct 18, through the port 54 and into the heat exchanger 52. Once treated by the heat exchanger 52, the treated air travels to the mechanical cooling system, which further treats the air. Provided in the bottom panel 50 of the housing 44 is an outlet port 58 and a filter bank 60 to filter the air prior to the air exiting through the outlet port 58. The outlet port 58 is in fluid communication with the supply duct 16, which delivers the cooled air back to the data center 10.

Figure 8:
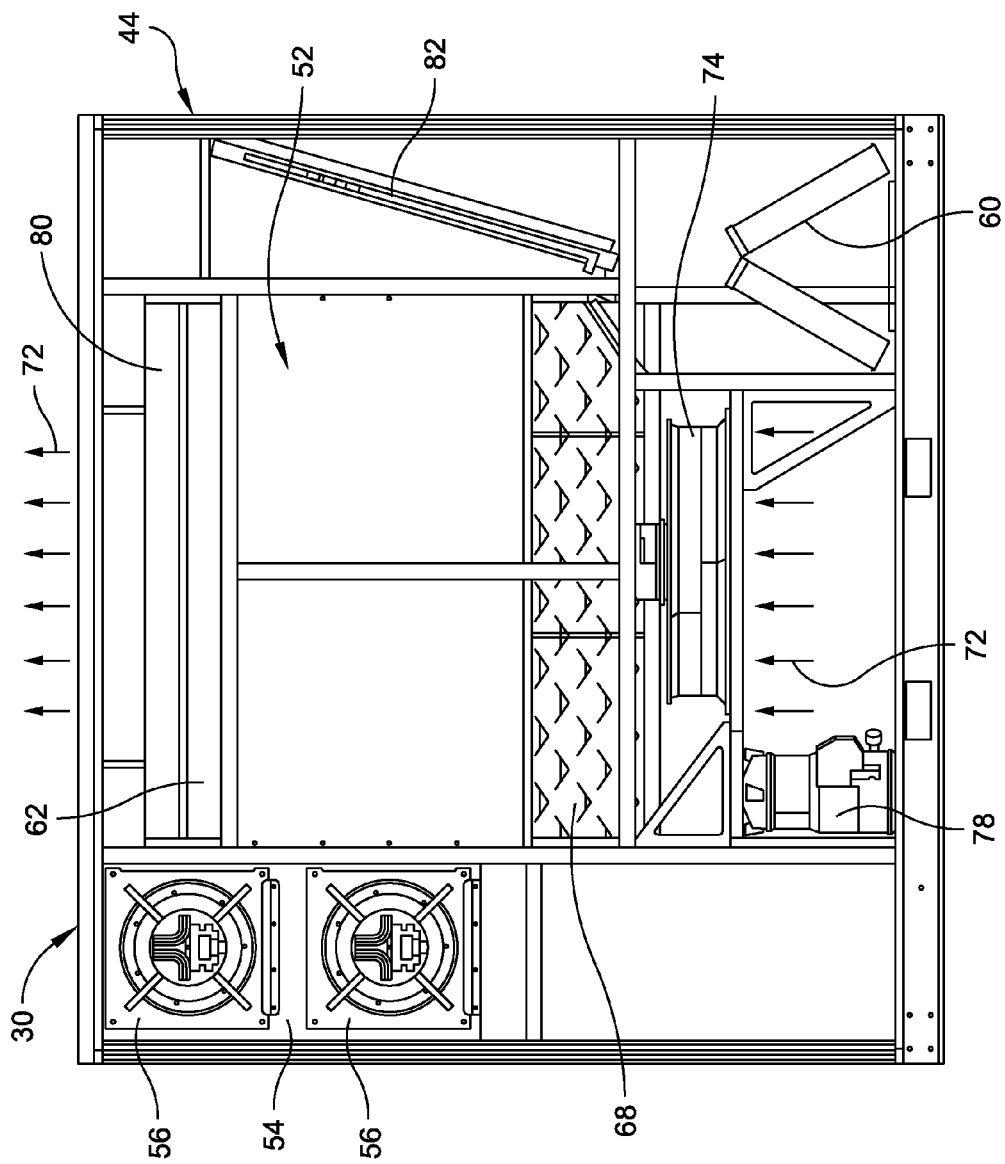
FIGS. 8-10 are front, left side and right side elevational views of the air handling unit shown in FIGS. 6 and 7.
Figure 10:
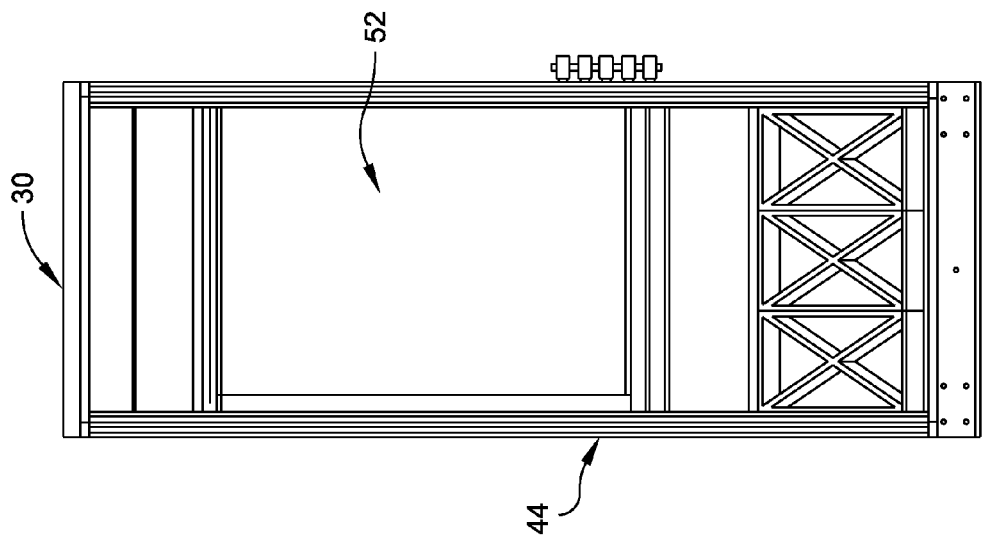
Figure 9:
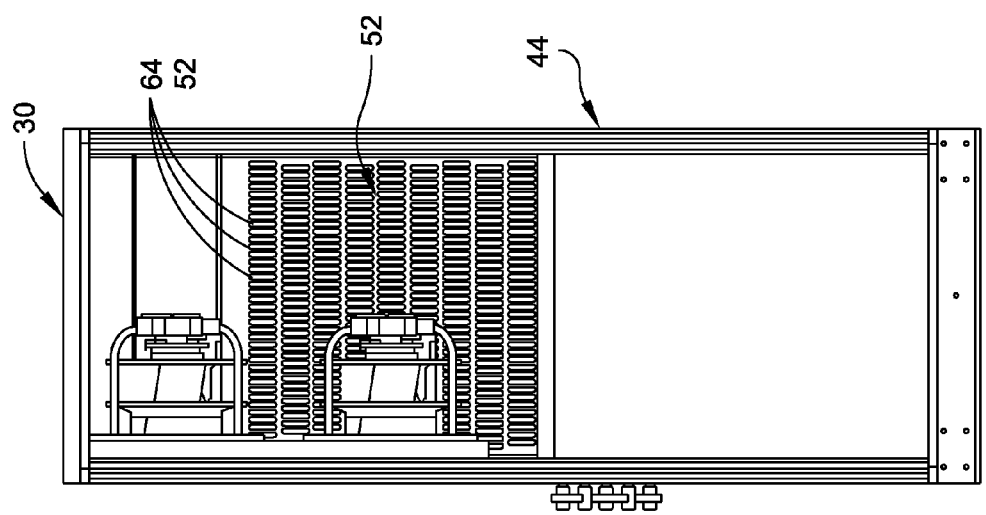
Figure 11:
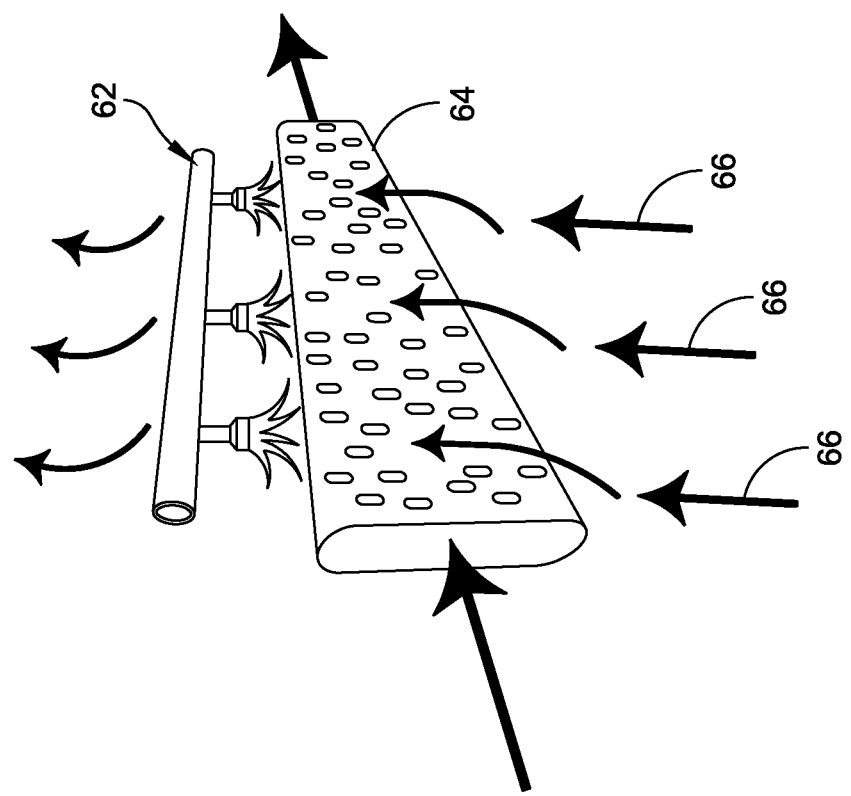
FIG. 11 is an enlarged schematic view of an evaporative heat exchanger of the air handling unit.

Referring to FIGS. 8-11, the air handling unit 30 further includes an evaporative cooling apparatus 62 supported by the housing 44. In the shown embodiment, the evaporative cooling apparatus 62 is configured to spray water on the air-to-air heat exchanger 52. In particular, the air-to-air heat exchanger 52 includes a plurality of tubes, each indicated at 64, which extend from one end of the heat exchanger to an opposite end of the heat exchanger. FIG. 9 illustrates open ends of the tubes 64 that receive the IT air. In one embodiment, the evaporative cooling apparatus 62 embodies a water sprayer connected to a distribution pipe of the water distribution and collection system 34. As illustrated in FIG. 11, the arrangement is such that the water sprayer sprays water on the plurality of tubes 64. In one embodiment, the air-to-air heat exchanger 52 may be purchased from Munters Corporation of Amesbury, Mass., in which the tubes 64 are fabricated from EPX polymer material. Sensible cooling of IT air entering the tubes 64 is achieved by the evaporation of water on outer surfaces of the tubes. The outdoor air flowing up through the tubes 64, around the outside of the tubes, which is indicated by arrows 66 in FIG. 11, absorbs heat extracted from the IT air flowing through the tubes.

The water runs over the tubes 64 and is collected by a water collection trough 68 disposed underneath the air-to-air heat exchanger 52. The water collection trough 68 is configured to channel water back to the water supply unit 38, which recycles the water for distribution among the air handling units 30. An open air port 70 is provided in the bottom panel 50 of the housing 44 (shown in FIGS. 6 and 7) to allow outside air to travel upwardly through and around the air-to-air heat exchanger 52 in a direction counter to the direction of water sprayed onto the plurality of tubes. Referring to FIG. 8, arrows 72 show the direction of outside air through the air handling unit 30. To facilitate the movement of outdoor air up through the air-to-air heat exchanger 30, a fan 74 is disposed in the space underneath the water collection trough 68. The fan 74 moves the outdoor air upwardly through the air-to-air heat exchanger 52 and is exhausted from the air handling unit 30 through an exhaust port 76 provided in the top panel 48 of the housing 44 (shown in FIGS. 6 and 7).

Referring particularly to FIGS. 8-10, the mechanical cooling system includes a compressor 78 provided at the bottom of the housing 44 adjacent the fan 74, a refrigerator condenser coil 80 disposed above the cooling apparatus 62, and an evaporator coil 82 located downstream from the air-to-air heat exchanger 52. As shown, the evaporator coil 82 is disposed at an acute angle with respect to a vertical plane. IT air treated by the air-to-air heat exchanger 52 travels through the evaporator coil 82 and is directed downward through the filter bank 60 and out through the outlet port 58. Warm air traveling through the air-to-air heat exchanger 52 travels through the condenser coil 80 before exiting through the exhaust port 76. In one embodiment, the condenser coil 80 includes microchannel coils that facilitate the cooling of coolant traveling through the coils. The mechanical cooling system includes a suitable coolant that travels from the compressor 78 to the condenser coil 80, from the condenser coil 80 to the evaporator coil 82, and from the evaporator coil 82 back to the compressor. An expansion valve (not shown) is disposed between the condenser coil 80 and the evaporator coil 82 to reduce (and expand) the coolant prior to the coolant entering the evaporator coil.

The operation of the air handling unit 30 is as follows. Outdoor (ambient) air is drawn into the air handling unit 30 through the open air port 70 and is directed by the fan 74 to the air-to-air heat exchanger 52. Heat absorbed by the outside air travels through the condenser coil 80 and exits the air handling unit 30 through the exhaust port 76. Meanwhile, IT air is drawn into the air-to-air heat exchanger 52 from the return duct 18 with the assistance of the two fans 56. The IT air enters the tubes 64 of the air-to-air heat exchanger 52 and is cooled by the air-to-air heat exchanger. The IT air is then passed through the evaporator coil 82 to further cool the air by direct expansion. Cooled IT air flows through the filter bank 60 and is then discharged through outlet port 58 in which the treated IT air is returned to the data center 10 by the supply duct 16.

Referring back to FIG. 1, it is observed that the individual air handling units of each container receives IT air from the return duct that is connected to the data center. Hot air generated by the data center is moved by the fans provided within the air handling units. The IT air is cooled by the air handling units and discharged to the supply duct in which the treated air is returned to the data center. The number of containers depends on the size of the data center. The cooling solution offered by embodiments of the disclosure provides a scalable solution to cooling in which any number and size of containers having air handling units may be provided. Since each container includes several air handling units, e.g., eight such units, capacity and redundancy offered by the cooling systems disclosed herein are improved.

In some data centers, it may be desirable to provide an easily deployable and a highly efficient/effective cooling solution for the evolving IT container market. It may also be desirable to provide highly available cooling by means of fault tolerance and minimal single points of failure. Further, eliminating the need for additional foot print for cooling infrastructure is desirable. The solution should be incrementally deployable to avoid high upfront capital investment for infrastructure that exceeds what is needed to address IT loads, and consistent with proposed revisions to ASHRAE 90.1 Energy Standards for integrated air-side economizer system for data center cooling.

There is presently a trend to deploy IT equipment in ISO containers modified to provide suitable housing and protection for the electronic equipment. Typically, these "containerized" data center modules do not contain the cooling equipment required to address heat build-up within the modules. The volume within the container is optimized for housing electronics leaving little room for cooling equipment. Many implementations of "white space containers" may have fan-coil units designed to reject heat into chilled water. The source of chilled water would typically be provided by some form of mechanical infrastructure. This approach requires a separate foot print for the cooling system along with assumptions on optimal incremental build out size. These central plant chilled water solutions would more often than not require initial capital investment in infrastructure capacity that exceed on-line IT loads. Additionally, the central plant method will likely result in many ISO containers supported by single points of failure within the cooling system or requiring even greater investment. Such chilled water-based solutions are limited to water side economization, which underperform when compared to air side economization in most if not all climates.

Presently, the containerized IT market uses chilled water as the cooling medium and pipes a source of chilled water to the ISO container housing the IT equipment. This requires an external chiller plant along with heat of rejection equipment (cooling tower) and a pumping system. Typically, this portion of the physical infrastructure is designed for a one plant to a many container architecture. This approach requires an initial build-out of cooling infrastructure greater than the day-one IT load, thus creating an initial capital investment above a truly pay as you grow type solution. Also, turn down of such chiller plants may be problematic if the actual initial load is substantially below the chiller plant design point. The footprint of such a chilled water plant infrastructure is above and beyond that required by the containerized IT equipment, adding to physical space requirements of the facility. The chiller is designed to accommodate full demand of the cooling load by the vapor compression cycle, such a design would also need to be backed up by emergency diesel generator. Having the full heat load accommodated by chiller vapor compression adds substantially to generator sizing and sizing of associated switch gear.

Figure 12:
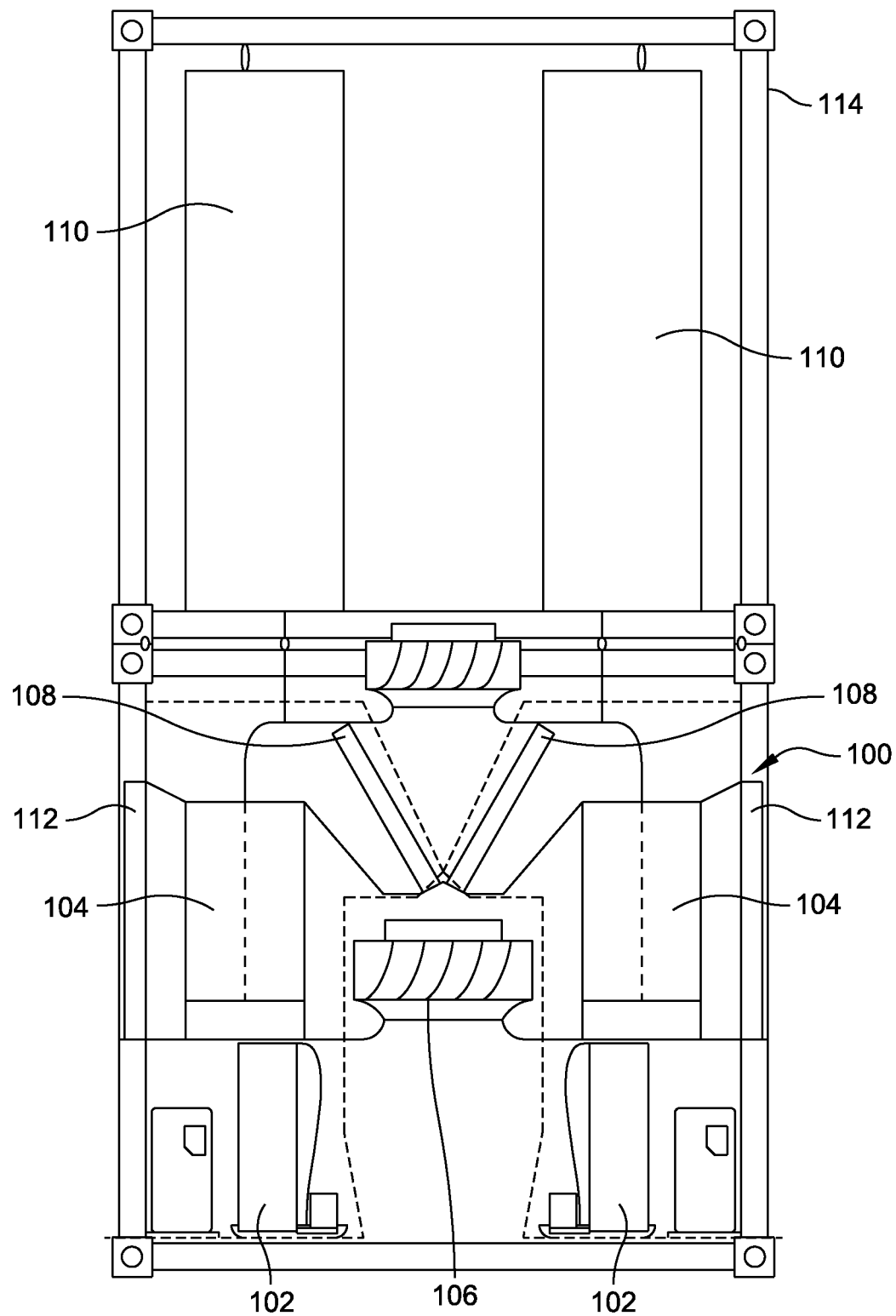
FIG. 12 is a cross-sectional view of a cooling system of an embodiment of the disclosure depicting the various state points for the two distinctive air circulation paths.

FIG. 12 shows a sectional view of the cooling system generally indicated at 100 depicting the various state points for the two distinctive air circulation paths. Ambient air is drawn through an evaporative cooling apparatus 102 that may or may not be wetted depending upon the present operating conditions. If wetted, the air leaving the evaporative cooling apparatus 102 is cooled to a temperature approaching an initial wet-bulb temperature. The air is then forced through outdoor air passages of an air-to-air heat exchanger 104 by a circulation fan 106. The air leaving the circulation fan 106 is relatively cooler than the heated IT equipment exhaust air.

The difference in temperature of these fluids promotes heat transfer across the air-to-air heat exchanger 104 thermal interface. The warmer air gives up thermal energy to the cooler air. This heat transfer causes the IT air leaving the heat exchanger 104 to be cooler than the IT air entering and the outdoor air leaving the heat exchanger to be warmer than the outdoor air entering the heat exchanger. In some cases, the IT air leaving the air-to-air heat exchanger 104 may not have been sufficiently cooled by this process alone. In this case, a mechanical cooling system is activated further, thus cooling the air leaving an evaporator coil 108 to a temperature suitable for supply air to IT equipment housed by racks 110.

During the operation of the mechanical cooling system, a refrigeration condenser 112 is also active, thus rejecting thermal energy into the circulated outdoor air. The outdoor air is heated by the condenser 112. It is anticipated that this cooling architecture may work with either container-based data centers by placing an IT container 114 to be cooled directly on top the modular cooling system 100 or by ducting the IT entering air and leaving air ports into a more traditional brick and mortar building.

In one embodiment, the cooling sub-base is constructed using components from a standard ISO container design, including ISO corner blocks used for anchorage and stacking of containers. The upper surface would have supply air ports running down the center for discharge of conditioned air into openings in the bottom of the IT module stacked upon it. Additionally, the upper surface of the sub-base would have bilateral warm return air ports running length wise along the outter edges. These ports connecting to the outer hot air plenums of the stacked IT module allow transfer of hot air from the plenums into the cooling modules for cooling before being supplied back into the IT module through the supply air ports. The cooling system(s) are comprised of a plurality of bilateral cooling modules running the length of each side, typically eight such modules would be installed along each side for a total of sixteen modules. This quantity is only representative as the actual configuration and module count could vary. The cooling modules and sub-base frame are constructed such that the cooling modules may be removed from the sub-base for repair or replacement. Additionally, it is possible that the sub-base may not be initially populated with its full compliment of cooling modules, thus having additional modules added on an as-needed basis for either increased capacity or additional redundancy or both. The cooling modules sharing a common design and geometry allows the interchangeability of cooling modules.

Figure 13:
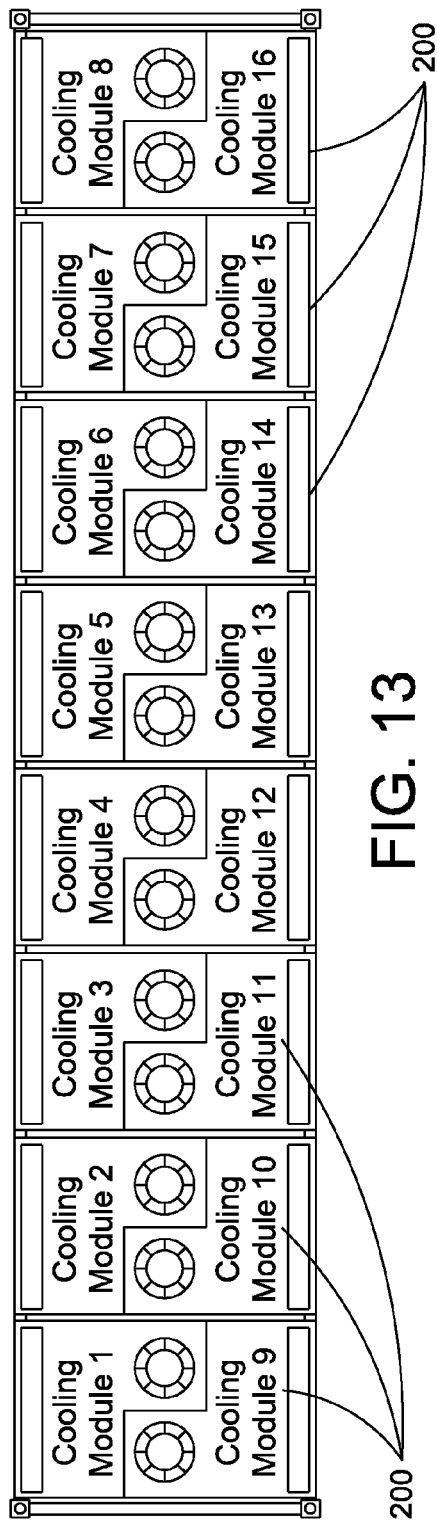
FIG. 13 is a top plan view of an ISO container sub-base of an embodiment of the disclosure with integrated cooling and cooling modules configured to fit with one another.

Referring to FIG. 13, which illustrates a top plan view of an ISO container sub-base with integrated cooling, the cooling modules, each indicated at 200, are configured to fit with one another.

Figure 14:
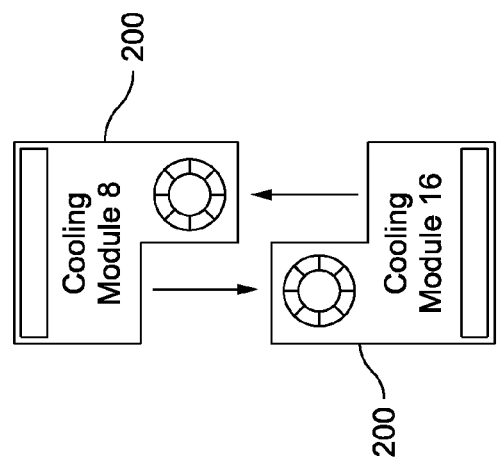
FIG. 14 is view showing opposing cooling modules nested together.

Specifically, as shown in FIG. 14, the opposing cooling modules 200 are nested together in the manner illustrated in the drawing figure.

Figure 15:
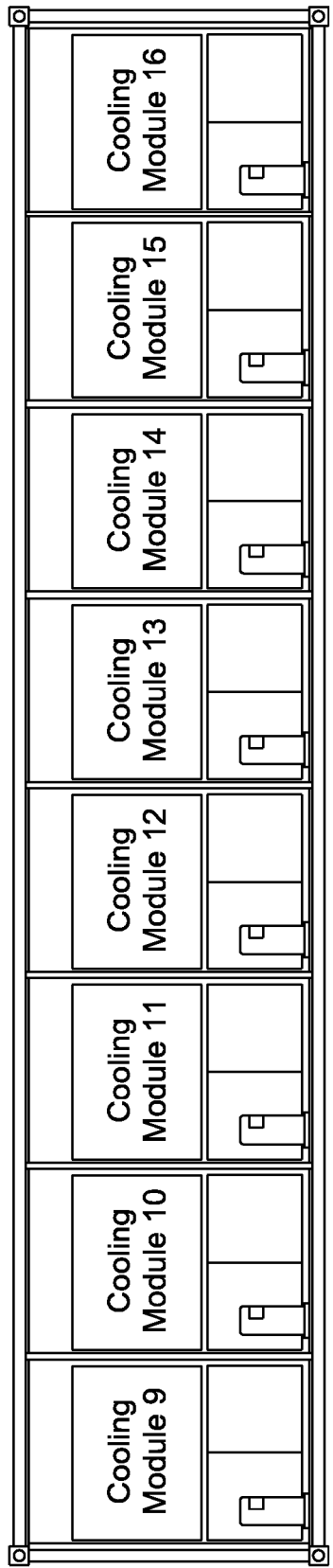
FIG. 15 is a side elevation view of the ISO container shown in FIG. 13 with diagonal cross bracing removed.

Referring to FIG. 15, which illustrates a side elevation view of the ISO container shown in FIG. 13 with diagonal cross bracing removed, the cooling modules are substantially the same height as the ISO container.

In another embodiment, the cooling modules are fully self-sufficient, comprising all of the components needed to support its designed incremental cooling capacity. Each module requires only the connection of utility/generator power and water supply for adiabatic assisted cooling. Each cooling module comprises: an air to air heat exchanger; a circulation fan to address process air (IT airflow); a circulation fan to address working air (outdoor air); dampers; a compressor; a condenser coil; an evaporator coil; an expansion valve; an evaporative cooling apparatus; a water circulation and treatment system; and all necessary controls. Each module would also be provided with a serial communication interface to the other modules for cordination of redundancy and capacity control. The cooling modules may further include an ozone generator for chemical free treatment of the adiabatic evaporator water.

The sub-base architecture allows cooling provisioning to be added incrementally with additional IT load. As additional IT containers are needed, the containers are stacked upon added cooling sub-bases. This approach allows for incremental infrastructure provisioning consistent with IT provisioning. Additionally, not having a central type cooling architecture greatly enhances fault tolerance of facility. Should one of the cooling sub-bases experience a catastrophic failure, it would only effect its associated ISO container.

The inclusion of integrated air to air economizer cycle also improves percentage of load hours handled with economizer over that of a chilled water plant. Additionally the integrated air side economizer with adiabatic assist would always be able to accommodate some percentage of IT load, substantially reducing design capacity for vapor compression cooling system and associated power draw required by vapor compression cycle. The reduction of power demand will allow smaller sizes of generator and switch gear.

The use of a cooling sub-base, stacking of an IT ISO container on a cooling ISO container, is believed novel. The integration of an air-to-air heat exchanger into such a system with added benefit of adiabatic assisted cooling is also considered novel for the particular embodiment. Additionally, sizing the mechanical system for less than full design capacity is also considered novel.

The system described herein may be housed in a structure that takes on the characteristic dimensions and features of an ISO container, such that it may physically interface with other ISO containers of similar construction. These other ISO containers may also be configured to house IT equipment to be cooled.

ISO containers are normally made of steel and were originally eight feet wide by eight feet high and either 20 feet or 40 feet long. Such ISO containers may be stacked up to seven units high. ISO containers may be carried by container ship, freight train and truck. Taller ISO containers have been introduced, including containers that are eight feet six inches, nine feet six inches, and ten feet six inches high. The United States often uses longer containers at 48 feet and 53 feet long. European containers are often about two inches wider. Each container may be allocated standardized ISO 6346 reporting mark (ownership code) that is four characters long ending in the letter U, and followed by 6 numbers and a check digit. Container capacity is often expressed in twenty foot equivalent units ("TEU" or sometimes "teu"). An equivalent unit is a measure of containerized cargo capacity equal to one standard 20 foot length by eight foot width container.

ISO Containers also may be used to create buildings and house large computer data centers.

The system described herein may have a series of bilateral ports arranged along a surface for interface to the IT load container. The ports may be used to receive the warm air from the IT load to the cooling system IT air intake.

The system described herein may have a series of ports arranged more or less along the centerline of a surface for interface to the IT load container. The ports may be used to supply cooled air to the IT load for it further use.

The system described herein may have sub-modules that are more or less identical and interchangeable.

The system described herein may have sub-modules designed to allow extension out and away from the ISO structure to permit ease of service and or repair.

The system described herein may be of a design that operation does not require the full compliment of sub-system modules to achieve an operational state. As such, the additional modules may be added while the system is in an operation state to increase either redundancy or capacity or both.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

The invention claimed is:

1. A modular cooling system configured to treat IT air generated by a data center, the modular cooling system comprising:
   a plurality of ISO containers located outside the data center and movably coupled to the data center:
   a supply duct configured to be selectively coupled to each of the plurality of ISO containers and to deliver conditioned air to the data center from the plurality of ISO containers;
   a return duct configured to be selectively coupled to each of the plurality of ISO containers and to deliver IT air to the plurality of ISO containers from the data center; and
   a plurality of cooling sub-system modules positioned within each of the plurality of ISO containers, the plurality of cooling sub-system modules being configured to operate in parallel to achieve total cooling effect or a lesser cooling effect within the data center, each cooling sub-system module comprising:
   a housing configured to support cooling equipment,
   an air-to-air heat exchanger supported by the housing to cool IT air supplied by the return duct, the air-to-air heat exchanger having at least one tube configured to direct IT air from one end of the air-to-air heat exchanger to an opposite end of the air-to-air heat exchanger and configured so that outdoor air circulates around the at least one tube, and
   a mechanical cooling system supported by the housing, the mechanical cooling system being configured to receive IT air treated by the air-to-air heat exchanger and to provide further cooling to the treated IT air, the mechanical cooling system including a compressor provided at a bottom of the housing, a refrigerator condenser coil disposed directly above the air-to-air heat exchanger, and an evaporator coil located downstream from the air-to-air heat exchanger, the arrangement being such that IT air treated by the air-to-air heat exchanger travels through the evaporator coil and is directed to an outlet port in fluid communication with the supply duct.

2. The modular cooling system of claim 1, further comprising, a fluid communications network that interconnects cooling sub-system modules of the modular cooling system with the data center to deliver cool air to the data center and to exhaust warm air from the data center.

3. The modular cooling system of claim 1, wherein the fluid communications network includes a supply duct configured to deliver cooled or treated air from the cooling sub-system modules to the data center and a return duct configured to deliver IT air from the data center to the cooling sub-system modules.

4. The modular cooling system of claim 1, wherein each cooling subsystem module further comprises an evaporative cooling apparatus supported by the housing, the evaporative cooling apparatus being configured to spray water on the at least one tube.

5. The modular cooling system of claim 4, further comprising a water distribution and collection system configured to deliver cooling water to the evaporative cooling apparatus of the plurality of cooling sub-system modules and collect cooling water from the plurality of cooling sub-system modules.

6. The modular cooling system of claim 5, wherein the evaporative cooling apparatus includes a sprayer, and wherein the water distribution and collection sys includes a collection trough and a pump connected to the sprayer, the sprayer being configured. to spray water on the at least one tube and the collection trough being configured to collect water sprayed on the at least one tube.

7. The modular cooling system of claim 6, wherein the plurality of cooling sub-system modules are positioned along an exterior of each of the plurality of ISO containers and the water distribution and collection system is positioned interiorly with respect to the plurality of cooling sub-system modules.

8. The modular cooling system of claim 1, wherein the at least one tube comprises a plurality of tubes.

9. The modular cooling system of claim 1, further comprising at least one fan supported by the housing, the at least one fan being configured to circulate outdoor and IT air.

10. The modular cooling system of claim 9, wherein the at least one fan includes a first fan configured to direct outdoor air to the at least one tube and a second fan configured to direct IT air into the at least one tube.

11. The system of claim 1, wherein plurality of cooling subsystem modules supported by the ISO frame includes at least eight cooling sub-system modules.

12. A method of cooling IT air, the method comprising:
delivering IT air from a data center to a plurality of ISO containers by a return duct associated with each of the plurality of ISO containers, each of the plurality of ISO containers being located outside the data center and having a plurality of air handling units, each air handling unit having a plurality of tubes configured to direct IT air from one end of the air-to-air heat exchanger to an opposite end of an air-to-air heat exchanger and configured so that outdoor air circulates around the at least one tube;
delivering outside air around the tubes;
spraying water on the tubes;
delivering IT air from the tubes to a mechanical cooling system; and
returning treated IT air back to the data center from the plurality of air handling units by a supply duct associated with each of the plurality of ISO containers,
wherein the mechanical cooling system including a compressor provided at a bottom of the housing, a refrigerator condenser coil disposed directly above the air-to-air heat exchanger, and an evaporator coil located downstream from the air-to-air heat exchanger, the arrangement being such that IT air treated by the air-to-air heat exchanger travels through the evaporator coil and is directed to an outlet port in fluid communication with the supply duct.

13. The method of claim 12, further comprising delivering water to the plurality of air handling units from a water distribution and collection system.

14. The method of claim 13, further comprising collecting water from the plurality of air handling units.

15. The method of claim 12, wherein delivering IT air from the data center to the tubes and delivering outside air around the tubes are achieved by using fans.

* * * * *

UNITED STATES PATENT AND TRADEMARK OFFICE
CERTIFICATE OF CORRECTION

| | | |
|---|---|---|
| PATENT NO. | : 9,072,201 B2 | Page 1 of 1 |
| APPLICATION NO. | : 12/792161 | |
| DATED | : June 30, 2015 | |
| INVENTOR(S) | : John H. Bean, Jr. | |

It is certified that error appears in the above-identified patent and that said Letters Patent is hereby corrected as shown below:

In the Claims:

Column 11, claim 3, line 17, replace "claim 1" with --claim 2--;

Column 11, claim 6, line 35, replace "sys" with --system--;

Column 12, claim 12, line 18, replace "haying" with --having--.

Signed and Sealed this
Twenty-seventh Day of October, 2015

Michelle K. Lee
*Director of the United States Patent and Trademark Office*